March 24, 1970 J. SPIEGLER 3,501,833

ELECTRONIC DEVICE ENCLOSURE METHOD

Original Filed Oct. 12, 1964

INVENTOR.
JOHN SPIEGLER

BY Walter S. Zebrowski

ATTORNEY

United States Patent Office 3,501,833

Patented Mar. 24, 1970

3,501,833

ELECTRONIC DEVICE ENCLOSURE METHOD

John Spiegler, Bradford, Pa., assignor to Corning Glass Works, Corning, N.Y., a corporation of New York Original application Oct. 12, 1964, Ser. No. 403,125, now Patent No. 3,340,347. Divided and this application Feb. 27, 1967, Ser. No. 618,872

Int. Cl. H05k 3/28; B44d 1/18

U.S. Cl. 29—627 7 Claims

ABSTRACT OF THE DISCLOSURE

A method of manufacturing an enclosure for an electronic device providing great flexibility of internal contact plate patterns with standard external lead configurations is disclosed.

This application is a division of application Ser. No. 403,125, filed Oct. 12, 1964, now Patent No. 3,340,347.

BACKGROUND OF THE INVENTION

Electronic devices such as transistors, diodes, semiconductors, miniature integrated circuits including functional electronic blocks and silicone integrated circuits, and the like are commonly sealed in an enclosure or package having a body of electrically insulating material. Such a body is formed with a relatively large planar bottom wall surrounded by a rim defining a cavity within which an electronic element is disposed. Leads extending from within said cavity to the outside of said body are provided. The electronic element is connected to said leads within said cavity and is enclosed therein by a cover plate disposed over the cavity and sealed to said rim.

Heretofore enclosures were formed or fused or sintered glass particles within which preformed leads were embedded. Enclosures were also formed by sandwiching preformed leads between a pair of glass plates, fusing the plates together, and thereafter etching a cavity in one of said plates until the leads were exposed therein. Such structures required different and costly lead configurations to obtain desired internal lead patterns and consequently lead alignment was difficult. Furthermore, heat conductivity through such enclosures was low.

SUMMARY OF THE INVENTION

The objects of this invention are to provide an electronic device enclosure, assembly, and method of manufacture which is economical, provides flexibility of internal lead patterns, provides a hermetic seal about said leads, has high heat conductivity, and overcomes the heretofore noted disadvantages.

Broadly, according to the instant invention an enclosure for an electronic device may be manufactured by providing a flat dielectric substrate, forming a plurality of adherent contact plates of electroconductive material in a predetermined desired pattern on one flat surface of said substrate, bonding metallic leads to said contact plates so that they extend beyond the edges of said substrate, placing a glass ring over said leads about the periphery of said substrate, and thereafter fusing said ring to and about said leads and to said substrate thereby forming an enclosure body having a relatively large planar bottom wall and a rim at the periphery thereof defining a cavity suitable for receiving an electronic device, within which cavity at least a portion of said contact plates are exposed, said leads extending from said contact plates to the outside of said body. An electronic device may thereafter be placed in said cavity, connected to said contact plates, and enclosed therein by means of a cover sealed over said cavity.

Additional objects, features, and advantages of the present invention will become apparent to those skilled in the art, from the following detailed description and the attached drawing on which, by way of example, only the preferred embodiments of this invention are illustrated.

DETAILED DESCRIPTION

Figure 1:
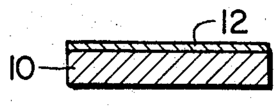
FIGURE 1 is a cross sectional view of a dielectric substrate to which is applied an electroconductive film.

The method or process for making a body for an electronic device enclosure is illustrated in FIGURES 1–4. Referring to FIGURE 1, a flat dielectric substrate 10 is cleansed by any suitable commercial cleaning method such as dipping in an ultrasonically agitated bath of acetone, xylene, trichlorethylene or the like, followed by an isopropanol bath and thereafter dried. One familiar with the art can readily select a suitable cleaning method. Suitable substrate materials are ceramics including alumina and beryllia; glazed ceramics; glass-ceramics; glass; glazed metals; and the like having high heat conductivity. A coating 12 of an electroconductive material is thereafter applied to one flat surface of substrate 10. Suitable coating materials are metals, metal alloys, and the like. Metallic materials are preferred because of their high electrical conductivity. Various methods of applying conductive coatings to dielectric substrates, such as electroless metal deposition, vapor deposition, and the like, are known in the art and one familiar with the art can readily select a suitable method. For examples of suitable coatings and methods of application thereof, reference is made to U.S. Patents Nos. 2,690,402 and 2,968,578.

Figure 2:
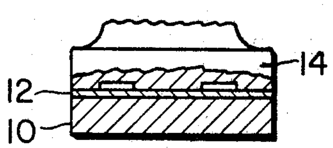
FIGURE 2 is a cross sectional view of the article of FIGURE 1 illustrating removal of a selected portion of the electroconductive film.
Figure 3:
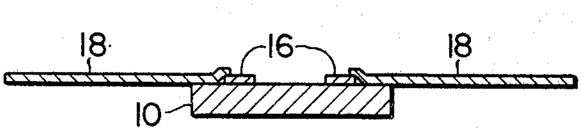
FIGURE 3 is a cross sectional view of the article of FIGURE 2 showing leads bonded to the remaining portions of the electroconductive film.

Referring to FIG. 2, predetermined portions of coating 12 are shown being removed by means of ultrasonically vibrated impact grinding tool 14 leaving those portions of coating 12 which form contact plates 16 as shown in FIG. 3. Although portions of coating 12 are shown being removed by impact grinding, they may also be removed by any other suitable method such as etching, sand blasting and the like, or coating 12 may be applied selectively to substrate 10 so that only contact plates 16 are formed, withoat the need for removing any portion of the coating. Electrodes or leads 18 are disposed in contact with contact plates 16, in a manner so that they extend beyond the edges of substrate 10 and are bonded to contact plates 16 by any suitable means such as resistance welding, ultrasonic vibration bonding, brazing, soldering, and the like. The lead material may be any electrically conducting material, however, it should have a coefficient of thermal expansion compatible with that of substrate 10 to prevent structural failure during sealing thereof as hereinafter described. Suitable lead materials are nickel, nickel-iron (Kovar), copper clad iron-nickel (Dumet), Niron, Sylvania 4, and the like metals and alloys.

Figures 4, 5, 6:
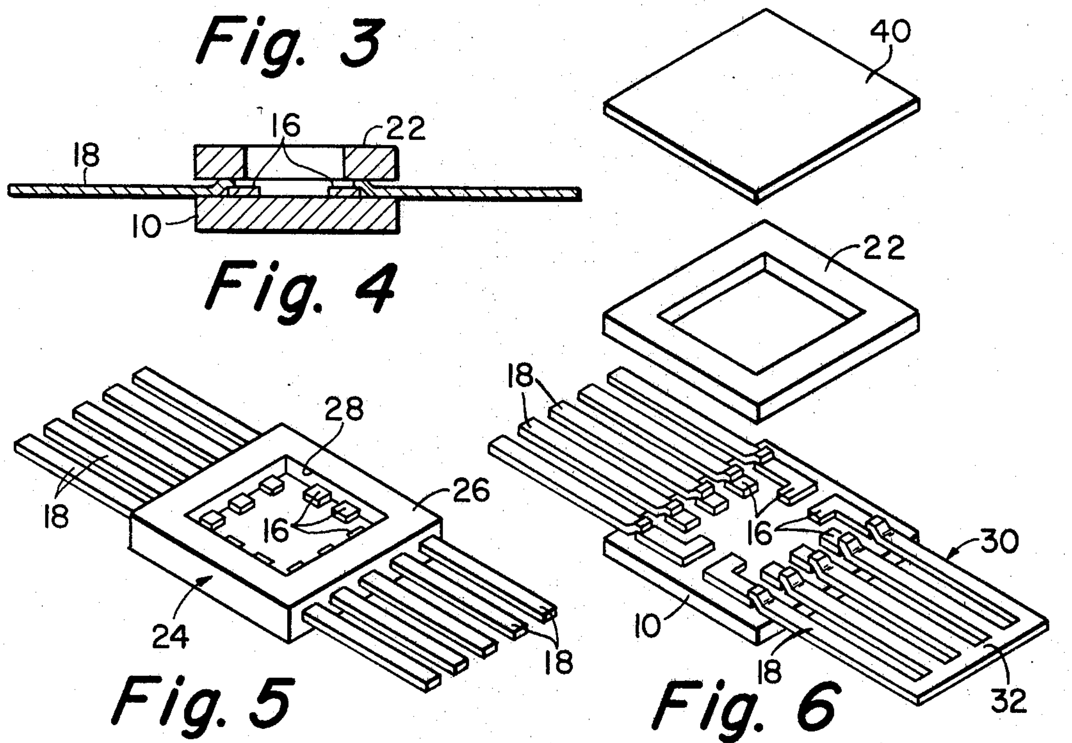
FIGURE 4 is a cross sectional view of the article of FIGURE 3 illustrating a ring placed on the leads and the substrate.
FIGURE 5 is an oblique view of an electronic device enclosure body according to the present invention.
FIGURE 6 is an exploded view of an electronic device enclosure according to the present invention.

A glass ring 22 is disposed about the periphery of substrate 10 in contact with leads 18 and extends over the bond between said leads and contact plates 16 as shown in FIG. 4. Ring 22 is then fused to substrate 10 to form an enclosure body 24 as shown in FIG. 5. Body 24 has a rim 26 defining cavity 28, within which cavity at least a portion of contact plates 16 are exposed. While ring 22 is being fused to substrate 10, leads 18 are caused to become hermetically sealed to body 24, said leads extending outwardly from contact plates 16 beyond the outside surfaces of body 24. To promote adhesion of said leads to said ring, the leads may be suitably plated or coated in a manner well known to one familiar with the art.

A Dumet sealing glass suitable for ring 2 may be one having a composition in weight percent consisting essentially of 0–15% $Na_2O$, 0–20% $K_2O$, the total of said $Na_2O$ and $K_2O$ being 12–20%, 1–10% CaO, 0–10% MgO, the total of said CaO and MgO being 1–10%, 0–5% $Al_2O_3$, 2–5% cobalt oxide computed as $Co_3O_4$, 2–10% iron oxide computed as $Fe_2O_3$, 0.2–1.1% reduced sulfur computed as free sulfur, up to 3% reduced carbon computed at free carbon, and 65–76% $SiO_2$. A Kovar sealing glass suitable for ring 22 may be one having a composition in weight percent consisting essentially of 15–21% $B_2O_3$, 0–4% $Na_2O$, 1–6% $K_2O$, 0–1.0% $Li_2O$, the total of said $Na_2O$, $K_2O$, and $Li_2O$, being 4–6%, 2–5% $Al_2O_3$, 2–10% iron oxide computed as $Fe_2O_3$, 0.05–0.5% sulfur computed as free sulfur, 2–5% cobalt oxide computed as $Co_3O_4$, and 56–64% $SiO_2$. The present invention, however, is not limited to such glasses.

Referring now to FIG. 6, leads 18 may be individually formed and bonded to contact plates 16 as heretofore described. However, the leads may be formed by preparing a comb-like structure 30 having a plurality of teeth, which structure may be prepared by any suitable means well known in the art such as stamping, shearing chemical machining, or the like. The unattached ends of said teeth may thereafter be bonded to contact plates 16 as heretofore described, with the teeth then being separated by removing the attached portion 32 of structure 30, as by shearing, for example, whereupon the separated teeth become leads 18.

Figure 7:
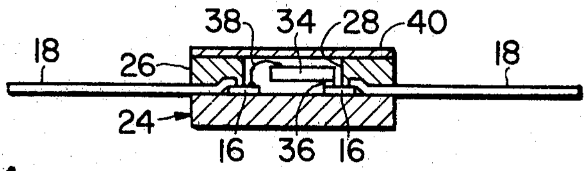
FIGURE 7 is a cross sectional view of an electronic device mounted within an enclosure according to the present invention.

An electronic element 34, such as a transistor chip, miniature circuit, or the like, may be placed within cavity 28 and directly connected to contact plates 16 by suitable bonding material 36 as shown in FIG. 7. Element 34 may also be connected to said contact plates by whisker wires 38 in a manner well known to one familiar with the art. A cover 40 is then sealed to body 24 about rim 26 by any of various methods well known in the art. To prevent deleterious effects on the element itself, such cover sealing methods generally employ much lower temperatures than are required in forming the body and hermetically sealing the leads.

A typical example of carrying out the present invention is as follows. A flat substrate is formed from glazed alumina and cleansed by dipping in a warm ultrasonically agitated xylene bath, followed by a warm isopropanol bath, and thereafter air dried. A layer of nickel having a thickness of about 0.0005 inch is then applied to one surface of said substrate by electroless nickel deposition. Portions of said layer are removed by an ultrasonically vibrated impact grinding tool leaving selected portions of said layer which form a plurality of contact plates arranged along two edges of said substrate. A pair of iron-nickel alloy (Kovar) comb-like structures are prepared having a thickness of about 0.003 inch. The unattached ends of the teeth of said structures are bonded to said contact plates by ultrasonic vibration bonding and extend beyond opposite edges of said substrate. A ring of Kovar sealing glass is disposed about the periphery of said substrate adjacent said leads. The assembly so formed is placed in a furnace and heated to 875° C. until said ring fuses to and unites with said substrate and said teeth become embedded in and hermetically sealed to said ring. Said ring forms a rim defining a cavity. After cooling, the attached portion of said comb-like structure is sheared off separating the teeth which form individual leads. An electronic element is then placed within said cavity and is connected to the contact plates by whisker wires. A glazed alumina cover is then sealed to the assembly about said rim.

The attached portion of said comb-like structure may be removed after the cover is sealed to the assembly, if desired.

An enclosure for an electronic device formed according to the above can be economically produced, provides a hermetic seal about the leads, has high heat conductivity, and provides flexibility of internal patterns of contact plates while the lead pattern remains the same, whereupon the same leads can be used for a large variety of contact plate patterns.

It should be noted that some electroless metal deposition methods can apply only a very thin film of metal. Such methods, however, may be used to apply a first film to the dielectric substrate to which first film additional metal may thereafter be applied by other methods such as, for example, electrolytic deposition to obtain the desired thickness of the electroconductive coating or contact plates.

Although the present invention has been described with respect to specific details of certain embodiments thereof, it is not intended that such details be limitations upon the scope of the invention except insofar as set forth in the following claims.

I claim:

1. The method of manufacturing an enclosure for an electronic device comprising providing a flat dielectric substrate, applying an adherent film of electroconductive material to one flat surface of said substrate, removing a portion of said film, the remaining portion thereof forming a plurality of adherent contact plates in a predetermined desired pattern, bonding metallic leads to said contact plates, said leads extending from said contact plates to beyond the edges of said substrate, disposing a glass ring over said leads about the periphery of said substrate, and fusing said ring to said leads and said substrate forming an enclosure body having a relatively large planar bottom wall and a rim at the periphery thereof defining a cavity within which at least a portion of said contact plates are exposed, said leads extending from said contact plates through said rim to the outside of said body.

2. The method of claim 1 wherein said flat dielectric substrate is formed of material selected from the group consisting of ceramics, glazed ceramics, glass-ceramics, glass, and glazed metals.

3. The method of claim 2 wherein said glass ring consists essentially by weight of 0–15% $Na_2O$, 0–20% $K_2O$, the total of said $Na_2O$ and $K_2O$ being 12–20%, 1–10% CaO, 0–10% MgO, the total CaO and MgO being 1–10%, 0–5% $Al_2O_3$, 2–5% cobalt oxide computed as $Co_3O_4$, 2–10% iron oxide computed as $Fe_2O_3$, 0.2–1.1% reduced sulfur computed as free sulfur, up to 3% reduced carbon computed as free carbon, and 65–76% $SiO_2$.

4. The method of claim 1 further comprising the steps of applying an adherent second film of metal to the first film of electroconductive material to form a composite coating prior to removing a portion of said first film, and thereafter removing a portion of said composite coating, the remaining portion of said coating forming a plurality of adherent contact plates in a predetermined desired pattern.

5. The method of claim 4 wherein said flat dielectric substrate is formed of material selected from the group consisting of ceramics, glazed ceramics, glass-ceramics, glass, and glazed metals.

6. The method of manufacturing an electronic device comprising the steps of providing a flat dielectric substrate, applying an adherent film of electroconductive material to one flat surface of said substrate, removing a portion of said film, the remaining portion thereof forming a plurality of adherent contact plates in a predetermined desired pattern, bonding metallic leads directly to said contact plates, said leads extending from said contact plates to beyond the edges of said substrate, disposing a glass ring over said leads about the periphery of said substrate, fusing said ring to said leads and said substrate forming an enclosure body having a relatively large planar bottom wall and a rim at the periphery thereof defining a cavity within which at least a portion of said contact plates are exposed, said leads extending from said contact plates through said rim to the outside of said body, disposing an electronic element within said cavity, and thereafter sealing said cavity.

7. The method of claim 6 wherein said flat dielectric substrate is formed of material selected from the group consisting of ceramics, glazed ceramics, glass-ceramics, glass, and glazed metals.

References Cited

UNITED STATES PATENTS

| | | | |
|---|---|---|---|
| 2,744,180 | 5/1956 | Sullivan | 29—622 |
| 2,771,663 | 11/1956 | Henry. | |
| 3,072,832 | 1/1963 | Kilby. | |
| 3,159,775 | 12/1964 | Ingraham. | |
| 3,320,353 | 5/1967 | Smith | 174—52.5 |
| 3,303,265 | 2/1967 | Noren et al. | 174—52.5 |
| 3,289,045 | 11/1966 | Pritikin et al. | 174—52.5 XR |
| 3,231,797 | 1/1966 | Koch. | |
| 3,314,128 | 4/1967 | Schutze et al. | 29—626 |
| 3,340,491 | 9/1967 | Deakin. | |

JOHN F. CAMPBELL, Primary Examiner

R. W. CHURCH, Assistant Examiner

U.S. Cl. X.R.

29—624, 629, 630; 65—59; 117—212; 156—3, 89; 174—52.6, 68.5; 264—272; 317—101, 234